(12) United States Patent
Cho

(10) Patent No.: US 6,369,577 B1
(45) Date of Patent: Apr. 9, 2002

(54) ELECTRONIC BATTERY TESTER

(75) Inventor: Yao L. Cho, Taipei (TW)

(73) Assignee: DHC Specialty Corp., Taipei (TW)

( * ) Notice: Subject to any disclaimer, the term of this patent is extended or adjusted under 35 U.S.C. 154(b) by 0 days.

(21) Appl. No.: 09/797,208

(22) Filed: Mar. 2, 2001

(51) Int. Cl.⁷ ............................................. G01N 27/416
(52) U.S. Cl. ......................................................... 324/426
(58) Field of Search ................................. 324/426, 429, 324/430, 433; 320/132, 149, DIG. 21; 340/635, 636; 429/61, 90

(56) References Cited

U.S. PATENT DOCUMENTS

| | | |
|---|---|---|
| 4,322,685 A | 3/1982 | Frailing et al. |
| 4,816,768 A | 3/1989 | Champlin |
| 4,825,170 A | 4/1989 | Champlin |
| 4,881,038 A | 11/1989 | Champlin |
| 4,912,416 A | 3/1990 | Champlin |
| 5,140,269 A | 8/1992 | Champlin |
| 5,343,380 A | 8/1994 | Champlin |
| 5,572,136 A | 11/1996 | Champlin |
| 5,574,355 A | 11/1996 | McShane et al. |
| 5,585,728 A | 12/1996 | Champlin |
| 5,592,093 A | 1/1997 | Klingbiel |
| 5,598,098 A | 1/1997 | Champlin |
| 5,757,192 A | 5/1998 | McShane et al. |
| 5,821,756 A | 10/1998 | McShane et al. |
| 5,831,435 A | 11/1998 | Troy |
| 6,002,238 A | 12/1999 | Champlin |
| 6,037,777 A | 3/2000 | Champlin |
| 6,037,778 A | 3/2000 | Makhija |
| 6,051,976 A | 4/2000 | Bertness |
| 6,091,245 A | 7/2000 | Bertness |

OTHER PUBLICATIONS

AES Battery Testers http://www.aeswave.com/framedcatalog/Products₁₃ Battery_Testers_MasterPage.htm, Automotive Electronic Services, 1997.

Primary Examiner—Edward H. Tso
(74) Attorney, Agent, or Firm—Fish & Richardson P.C.

(57) ABSTRACT

Evaluating the condition of a battery typically includes applying a load to the battery for a first time period, measuring a first voltage at the end of the first time period, removing the load from the battery, measuring a first voltage at the end of a first recovery time period after removing the load, measuring a second voltage at the end of a second recovery time period after removing the load, and analyzing the condition of the battery at the end of the second time period. The condition of the battery may be evaluated by using a hand-held electronic battery tester device that evaluates the condition of the battery by calculating the dynamic internal resistance of the battery in a time period of less than one second.

20 Claims, 6 Drawing Sheets

ELECTRONIC BATTERY TESTER

TECHNICAL FIELD

The invention relates to an electronic battery tester.

BACKGROUND

Current methods for determining the condition of a battery (e.g., a lead acid vehicle battery, such as an automotive battery) can use a high current typically require the use of heavy, bulky test equipment. The methods can also require that the battery have enough charge to perform the test. Other methods may use a smaller current, but these methods may depend heavily on the battery's state-of-charge, thereby making it difficult to test a battery that is deeply discharged. Additionally, the current methods for determining a battery's condition may take longer than is desired to perform a test.

SUMMARY

In one aspect, evaluating the condition of a battery includes applying a load to the battery for a first time period of three milliseconds to ten seconds, measuring a first voltage at the end of the first time period, removing the load, measuring a second voltage at the end of a first recovery time period after removing the load, measuring a third voltage at the end of a second recovery time period after removing the load, and analyzing the condition of the battery. The second recovery time period can be longer than the first recovery time period.

Analyzing the condition of the battery can include calculating a dynamic internal resistance for the battery at the end of the second recovery time period, and determining the condition of the battery based on the dynamic internal resistance of the battery. In certain embodiments, analyzing the condition of the battery can include displaying a capacity of the battery, a state of charge of the battery, and an indication of pass or fail. The method can include inputting a capacity of the battery and selecting the load to apply to the battery based on the capacity. Inputting the capacity can include selecting between an input based on one of cold cranking amps, cranking amps, amp hours, or other rating standard.

In another aspect, an electronic battery tester device includes a housing containing a load, a switch, cables exiting the housing for making electrical contact with terminals on the battery and contacting the switch, and an analyzing component that is structured and arranged to analyze the condition of the battery at the end of a first recovery time period and a second recovery time period. The switch applies the load to the battery for a first time period of between three milliseconds and ten seconds and removes the load from the battery. The analyzing component can include a calculating component that is structured and arranged to calculate the dynamic internal resistance for the battery and a determining component that is structured and arranged to determine the condition of the battery based on the dynamic internal resistance of the battery.

Implementations may include one or more of the following features. For example, the second time period may include a first recovery time period and a second recovery time period, where the second recovery time is longer than the first recovery time period. The first recovery period can be eight milliseconds to fifteen milliseconds, or ten milliseconds. The second recovery period can be forty milliseconds to eight hundred milliseconds, or sixty milliseconds.

The condition of the battery may be analyzed by calculating a dynamic internal resistance for the battery and determining the condition of the battery based on the dynamic internal resistance of the battery. The load may be between eighty amps and one hundred amps and may be based on inputting a rating system and a capacity for the battery being tested.

The method and tester carry out a single load, dynamic internal resistance measurement. The method and tester can obtain battery condition results within one second, and with high precision. The tester and method can reduce or eliminate the amount of heat generated during testing and is not affected by magnetic fields generated by other devices located nearby.

These general and specific aspects may be implemented using a device, a method, or a computer program, or any combination of devices, methods, and computer programs. For instance, one implementation may include a hand-held electronic battery tester device. The device may be used for evaluating a battery (e.g., lead acid automotive battery).

Other features and advantages will be apparent from the description and drawings, and from the claims.

DESCRIPTION OF DRAWINGS

Like reference symbols in the various drawings indicate like elements.

DETAILED DESCRIPTION

Figure 1:
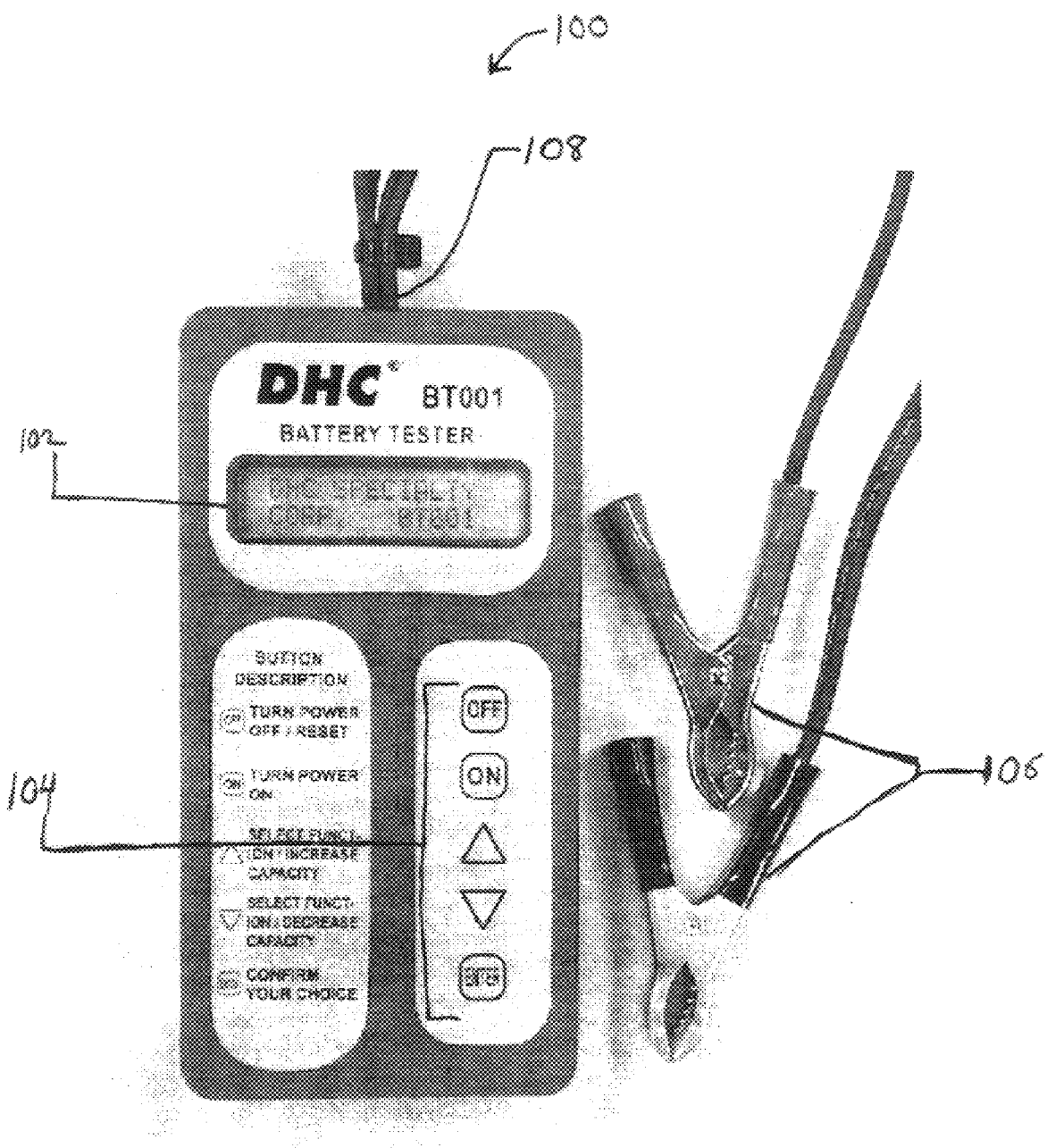
FIG. 1 is a picture of an electronic battery tester.

Referring to FIG. 1, an external view of an electronic battery tester device 100 is shown. In one implementation, the device 100 may be sized to fit in the palm of a user's hand. The device 100 typically includes a display module 102 (e.g., a liquid crystal display module (LCM)) for providing alphanumeric information, such as, information regarding the condition of the battery being tested, information regarding the selection of test inputs, and information regarding the status of the device 100. For example, the device 100 may display the battery capacity, the state of charge, and a pass or fail readout. The display module 102 may include one or more lines for displaying the alphanumeric information. The display lines may be fixed or may scroll the information.

The device 100 also typically includes a keypad 104 for operating the device 100. The buttons on the keypad 104 may have various definitions and may perform various different functions. For instance, buttons on the keypad 104 may include an "Off" button for turning powering down the device 100, an "On" button for starting the device 100, and an "Enter" button for confirming selections and beginning the test procedure. Other buttons may include buttons to select various functions and to make changes to selections (e.g., an "up arrow" button and a "down arrow button). The device 100 also may automatically power down and shut off if it has been idle for a predetermined period of time.

The device 100 also typically includes two clamps 106 for connected to the device 100 via cables 108. The clamps 106 are used to connect the device 100 to the respective terminals of the battery being tested.

Figure 2:
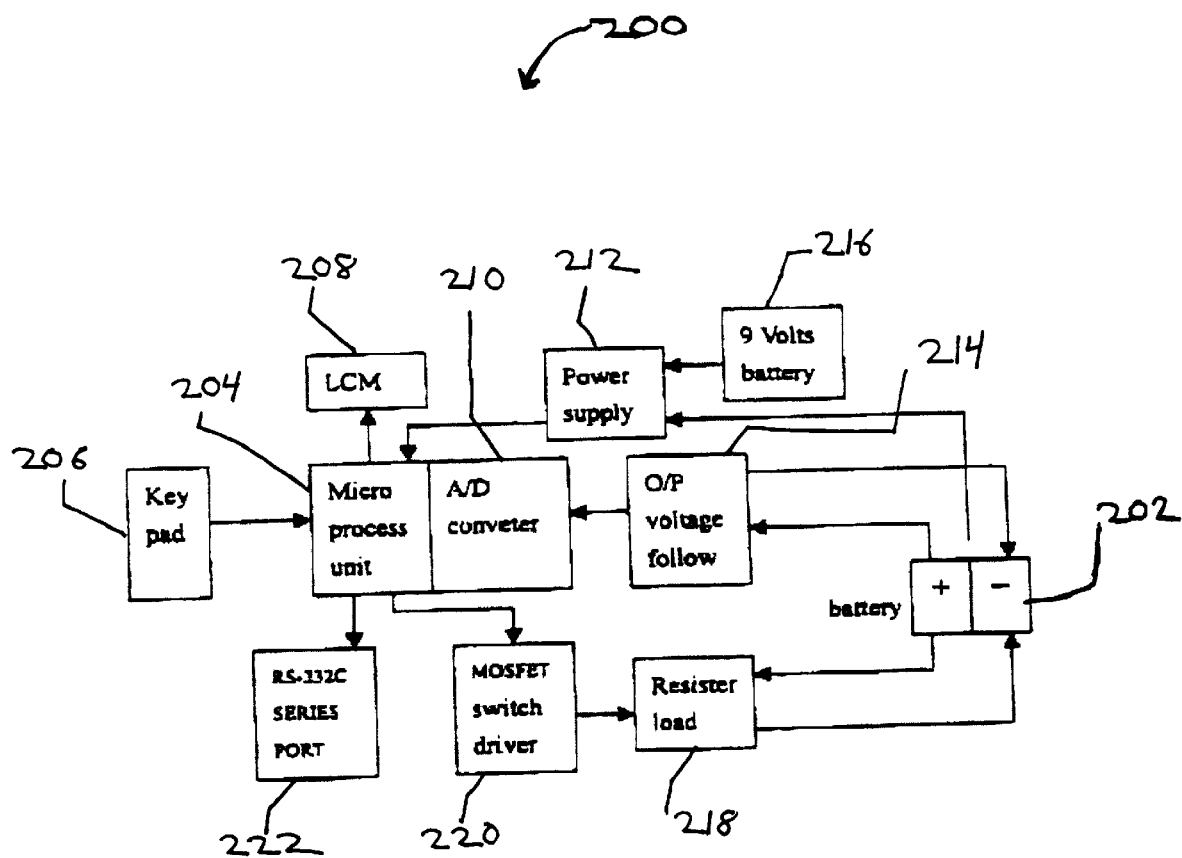
FIG. 2 is a block diagram of an electronic battery tester.

Referring to FIG. 2, a block diagram of the electronic battery tester device 200 is shown for evaluating the condition of a battery 202. The device 200 may test batteries of various voltages (e.g., a six volt battery and a twelve volt battery including a lead acid automotive battery). The device 200 typically includes a microprocessor 204, a keypad 206 corresponding to the keypad 104 of FIG. 1, a display 208 corresponding to the display 102 of FIG. 1, an analog-to-digital converter 210, a power supply 212, an operational amplifier 214, a battery 216 (e.g., a nine volt battery, or AA batteries) to power the tester, a resistor load 218, a switch driver 220 (e.g., a MOSFET switch driver), and a port 222. The microprocessor 204 is typically used in conjunction with the analog-to-digital converter 210 and the operational amplifier 214 to measure the voltage of the battery 202. The resistor load 218 may be selectable based on the battery's 202 stated rating and capacity, which may be included an as input parameter to the device 200. For instance, a 1 ohm resistor or a 0.1 ohm resistor may be selected as the resistor load 218 based on the inputted rating and capacity of the battery 202. The switch driver 220 is used to switch the resistor load 218 on and off during the evaluation of the battery's condition. The port 222 (e.g., RS-232C series port) may be used to connect an external device, such as a printer or a flash memory device that downloads software or programs, to the device 200.

Figure 3:
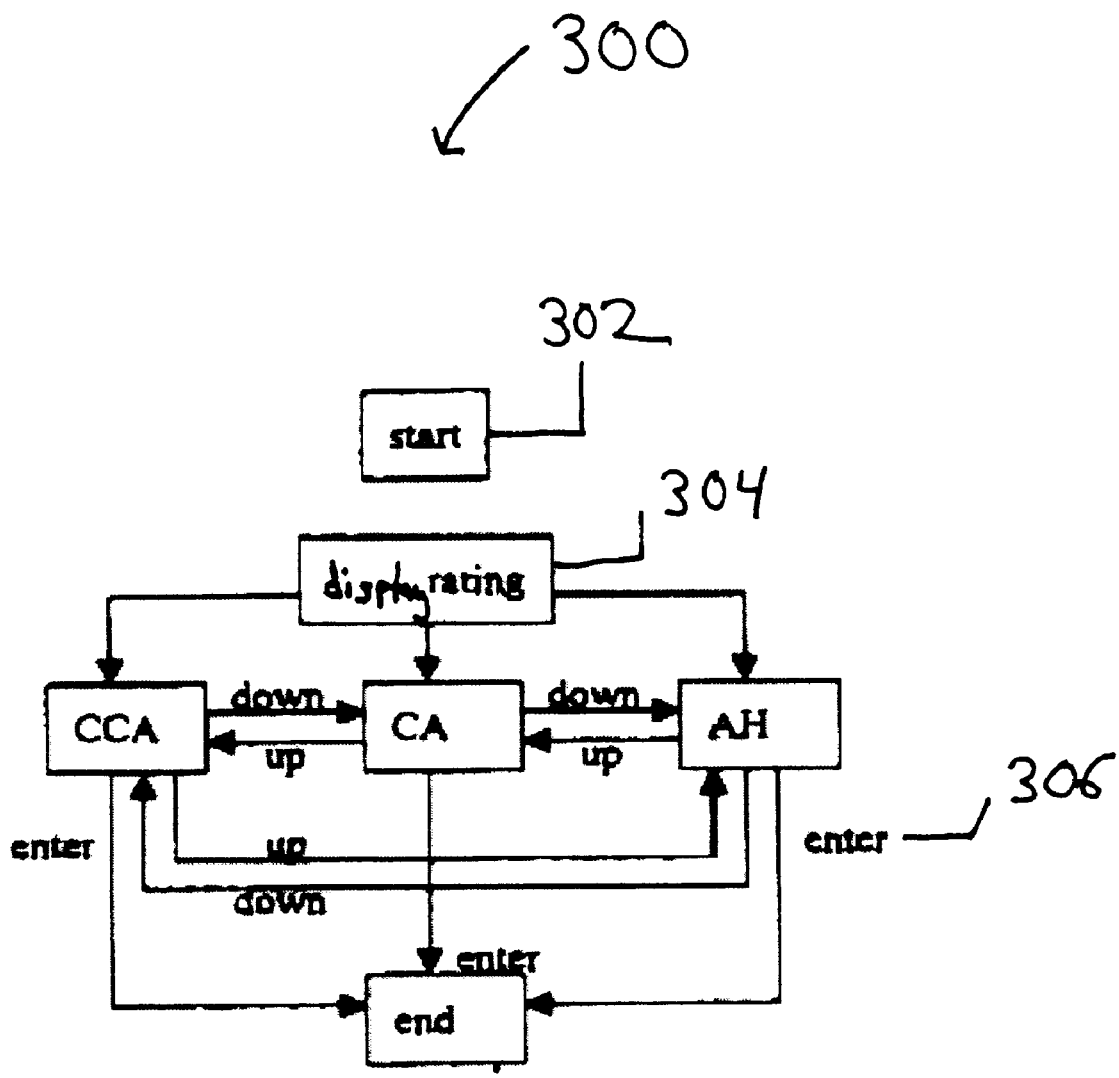
FIG. 3 is a flow chart for selecting the rating of a battery.

Referring to FIG. 3, a process 300 for selecting the rating of the battery to be tested is shown. The electronic battery tester device typically allows one of several different rating systems to be selected. For instance, in one implementation, a user may select "cold cranking amps" (CCA), "cranking amps" (CA), or "amp-hours" (AH). Other rating systems also may be selected. The process 300 typically includes starting (step 302) the process, displaying a rating system for selection (step 304), and confirming a displayed rating system (step 306) by depressing the "enter" button on the keypad. The various rating systems may be displayed (step 304) by using the up and down arrows on the keypad.

Figure 4:
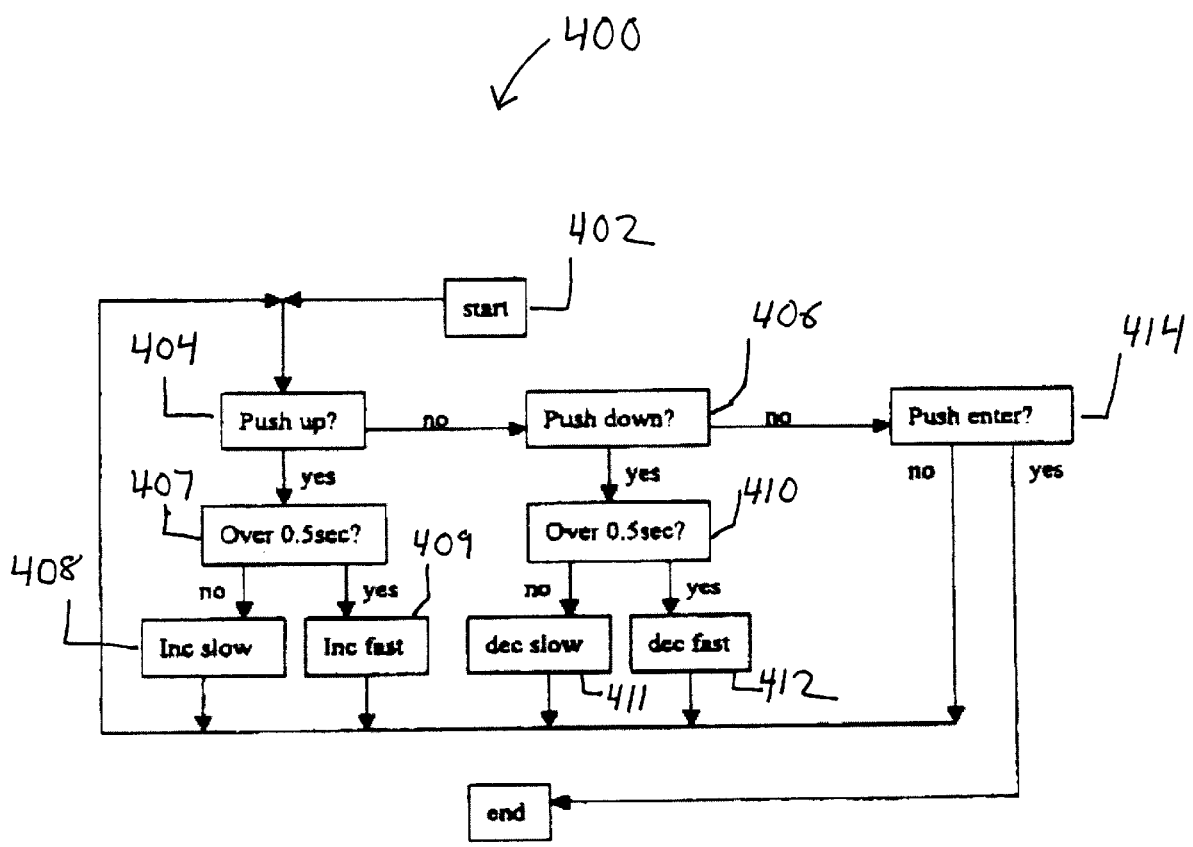
FIG. 4 is a flow chart for selecting the capacity of a battery.

After a rating system has been selected, the stated capacity of the battery being tested is typically selected. Referring to FIG. 4, a process 400 is shown for selecting the capacity of the battery. The process 400 typically includes starting (step 402) the process, increasing (step 404) or decreasing (step 406) the displayed capacity by depressing the up or down arrows on the keypad, increasing slowly if the up arrow is depressed and held for less than 0.5 seconds (steps 407 and 408), increasing fast if the up arrow is depressed and held for more than 0.5 seconds (steps 407 and 409), decreasing slowly if the down arrow is depressed and held for less than 0.5 seconds (steps 410 and 411), decreasing fast if the down arrow is depressed and held for more than 0.5 seconds (steps 410 and 412), and confirming a selection (step 414) by depressing the enter button on the keypad. In one implementation, the battery tester device may evaluate batteries with a range of between 40 to 2000 CCA, 50–2500 CA, 5–250 AH, and between 1 and 15 volts. The tester may test batteries that have been deeply discharged, such as batteries that have been discharged down to 1 volt.

Figure 5:
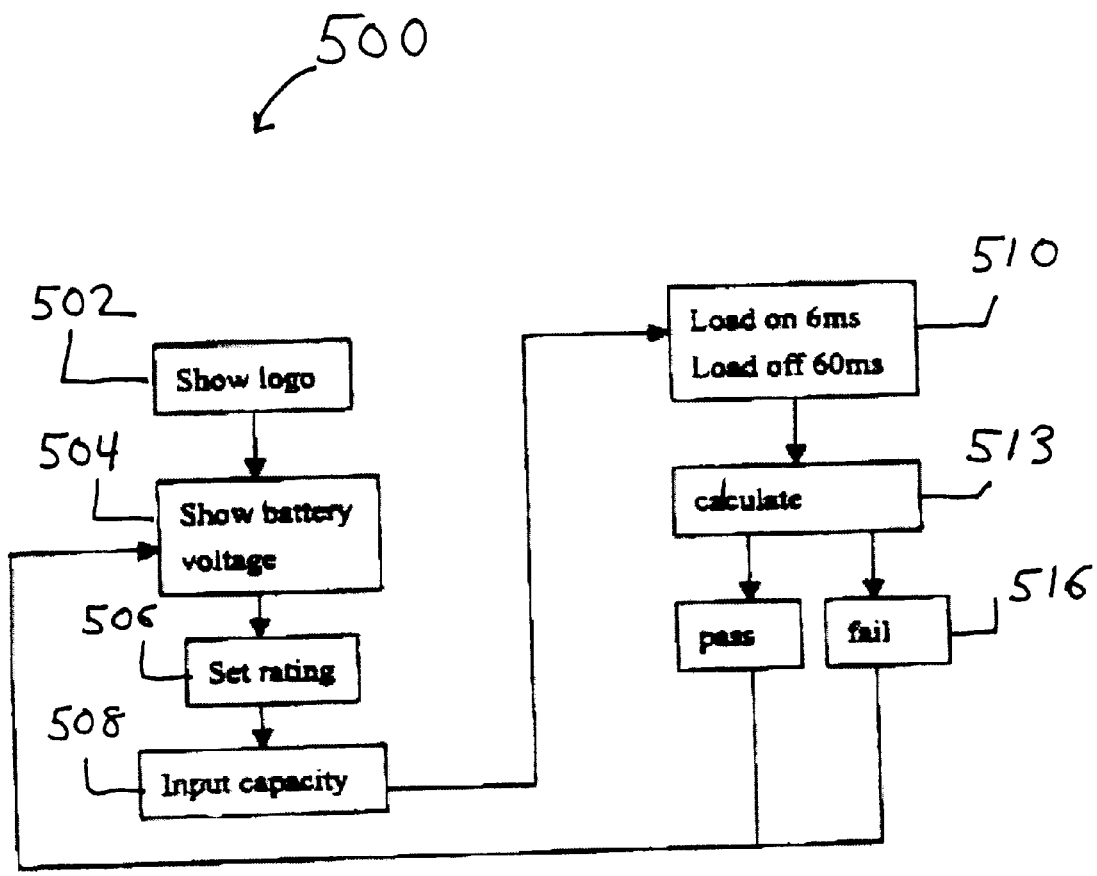
FIG. 5 is a flow chart for the process of evaluating the condition of a battery.

Referring to FIG. 5, a block diagram of the process 500 for evaluating the condition of a battery is shown. The process 500 typically includes displaying a first screen (step 502) that may include instructions or a logo, showing the battery voltage of the battery being tested (step 504), inputting the rating of the battery (step 506), inputting the capacity of the battery (step 508), applying and removing a load (step 510), calculating the condition of the battery (step 513), and displaying the evaluation results (step 516), which may include showing the battery voltage (step 504).

More particularly, the rating system of the battery is selected (step 506) as described above with respect to FIG. 3. The stated capacity of the battery is selected (step 508) as described above with respect to FIG. 4. The selected capacity (step 508) typically determines the load that will be applied during the evaluation. For instance, for battery capacities of less than 100 CCA, 120 CA, or 16 AH, a 1 ohm resistor load may be used. For battery capacities greater than 100 CCA, 120 CA, or 16 AH, a 0.1 ohm resistor load may be used.

Figure 6:
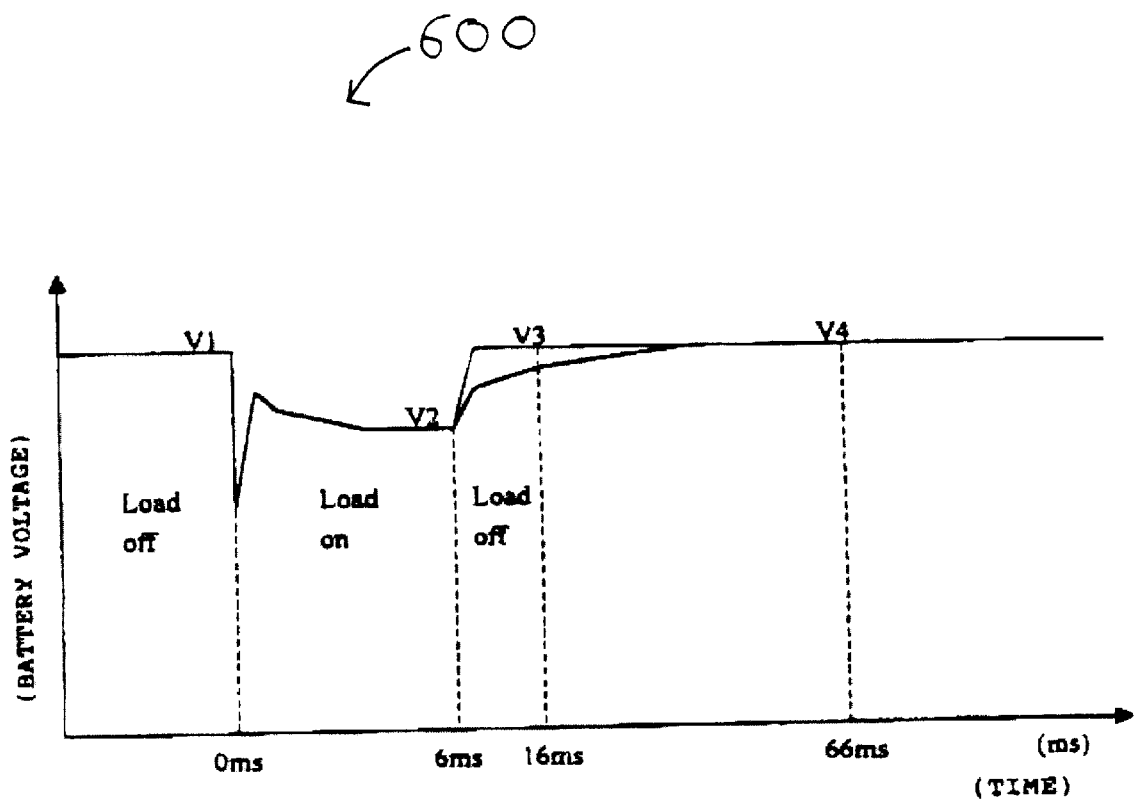
FIG. 6 is a graph of battery voltage versus time.

The condition of the battery may be calculated (step 513) by determining the internal dynamic resistance of the battery, using the applied single load (step 510). The load is typically applied (step 510) for a first time period. The first time period can be three milliseconds to ten seconds, four milliseconds to one second, five milliseconds to fifty milliseconds or six milliseconds to facilitate a rapid, accurate evaluation. Referring to FIG. 6, graph 600 shows that a first voltage (V2) is measured at the end of the first time period. The load is removed (step 510) and, after a time period elapses, which is typically longer than the first time period, a second voltage (V3) is measured at the end of a first recovery time period. The first recovery time period can be four milliseconds to one second, five milliseconds to five hundred milliseconds, six milliseconds to one hundred milliseconds, eight milliseconds to fifteen milliseconds, or ten milliseconds to facilitate a rapid, accurate evaluation. A third voltage (V4) may be measured at the end of a second recovery time period after removing the load. The second recovery time period can be thirty milliseconds to ten seconds, forty milliseconds to two seconds, fifty milliseconds to one second, or sixty milliseconds to facilitate a rapid, accurate evaluation. The second recovery time period is longer than the first recovery time period, for example, by fifty milliseconds. During the evaluation, a load of between 10 amps and 100 amps is typically applied.

The internal resistance of the battery is calculated according to the equation: $(V4-V2)/(V2/Rload)=Ri$, where Rload is the resistor load and Ri is the internal resistance. The internal resistance of the battery is used to calculate the capacity of the battery. The measured voltages also is used to determine whether the battery passes or fails (step 516). Whether the battery passes the test can be determined by calculating the capacity of the battery and comparing with the input capacity. If the calculated capacity is greater than a predetermined percentage of the input capacity, for example, ninety percent, the battery passes the test. If V4–V3 is greater than a predetermined voltage, for example, 100 millivolts, then the battery passes the test. If V4–V3 is less than the predetermined voltage then the battery fails the test. If the battery fails the test, then it may be recharged and tested again. If the second evaluation fails, after a recharge, then the battery will not hold a charge and should be replaced. The overall time for evaluating the condition of a battery may be less than one second, less than 500 milliseconds, less than 250 milliseconds, or less than 100 milliseconds.

The described systems, methods, and techniques may be implemented in digital electronic circuitry, computer hardware, firmware, software, or in combinations of these elements. Apparatus embodying these techniques may include appropriate input and output devices, a computer processor, and a computer program product tangibly embodied in a machine-readable storage device for execution by a programmable processor. A process embodying these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially-designed ASICs (application-specific integrated circuits).

A number of implementations have been described. Nevertheless, it will be understood that various modifications may be made. For example, advantageous results still could be achieved if steps of the disclosed techniques were performed in a different order and/or if components in the disclosed systems were combined in a different manner and/or replaced or supplemented by other components. Accordingly, other implementations are within the scope of the following claims.

What is claimed is:

1. A method for evaluating the condition of a battery, the method comprising:
    applying a load to the battery for a first time period of three milliseconds to ten seconds;
    measuring a first voltage at the end of the first time period;
    removing the load;
    measuring a second voltage at the end of a first recovery time period after removing the load;
    measuring a third voltage at the end of a second recovery time period after removing the load; and
    analyzing the condition of the battery.

2. The method of claim 1 wherein the first time period is four milliseconds to one second.

3. The method of claim 1 wherein the first time period is six milliseconds.

4. The method of claim 1 wherein the first recovery time period is four milliseconds to one second.

5. The method of claim 1 wherein the first recovery time period is five milliseconds to five hundred milliseconds.

6. The method of claim 1 wherein the first recovery time period is ten milliseconds.

7. The method of claim 1 wherein the second recovery time period is longer than the first recovery time period.

8. The method of claim 1 wherein the second recovery time period is thirty milliseconds to ten seconds.

9. The method of claim 1 wherein the second recovery time period is sixty milliseconds.

10. The method of claim 1 wherein analyzing the condition of the battery includes:
    calculating a dynamic internal resistance for the battery at the end of the second recovery time period; and
    determining the condition of the battery based on the dynamic internal resistance of the battery.

11. The method of claim 1, further comprising:
    inputting a capacity of the battery; and
    selecting the load to apply to the battery based on the capacity.

12. The method of claim 11 wherein inputting the capacity includes selecting between an input based on one of cold cranking amps, cranking amps, and amp hours.

13. The method of claim 1 wherein analyzing the condition of the battery includes displaying a capacity of the battery, a state of charge of the battery, or an indication of pass or fail.

14. An electronic battery tester device comprising:
    a housing containing a load;
    a switch, wherein the switch applies the load to the battery for a first time period of three milliseconds to ten seconds and removes the load from the battery;
    an analyzing component that is structured and arranged to analyze the condition of the battery at the end of a first recovery time period after removing the load and a second recovery time period after removing the load; and
    cables exiting the housing for making electrical contact with terminals on the battery and contacting the switch.

15. The device of claim 14 wherein the first time period is four milliseconds to one second.

16. The device of claim 14 wherein the first time period is six milliseconds.

17. The device of claim 14 wherein the first recovery time period is four milliseconds to one second.

18. The device of claim 14 wherein the second recovery time period is thirty milliseconds to ten seconds.

19. The device of claim 14 wherein the analyzing component includes:
    a calculating component that is structured and arranged to calculate the dynamic internal resistance for the battery; and
    a determining component that is structured and arranged to determine the condition of the battery based on the dynamic internal resistance of the battery.

20. A method for evaluating the condition of a battery, the method comprising:
    inputting a capacity of the battery;
    selecting a load to apply to the battery based on the capacity;
    applying the load to the battery for a first time period of five milliseconds to fifty milliseconds;
    measuring a first voltage at the end of the first time period;
    removing the load;
    measuring a second voltage at the end of a first recovery time period after removing the load, the first recovery time period being eight milliseconds to fifteen milliseconds;
    measuring a third voltage at the end of a second recovery time period after removing the load, the second recovery time period being fifty milliseconds to one second;
    calculating a dynamic internal resistance for the battery at the end of the second recovery time period; and
    determining the condition of the battery based on the dynamic internal resistance of the battery.

* * * * *